US012641817B2

(12) United States Patent
Hung et al.

(10) Patent No.: US 12,641,817 B2
(45) Date of Patent: May 26, 2026

(54) NITRIDE SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Hung Hung, Kawasaki Kanagawa (JP); Yasuhiro Isobe, Tokyo (JP); Akira Yoshioka, Yokohama Kanagawa (JP); Toru Sugiyama, Tokyo (JP); Hitoshi Kobayashi, Yamato Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 623 days.

(21) Appl. No.: 18/176,453

(22) Filed: Feb. 28, 2023

(65) Prior Publication Data

US 2024/0088280 A1     Mar. 14, 2024

(30) Foreign Application Priority Data

Sep. 9, 2022     (JP) ................................. 2022-143848

(51) Int. Cl.
*H10D 30/47*          (2025.01)
*H10D 62/824*        (2025.01)
(Continued)

(52) U.S. Cl.
CPC ......... *H10D 30/475* (2025.01); *H10D 62/824* (2025.01); *H10D 62/8503* (2025.01); *H10D 64/251* (2025.01); *H10D 64/511* (2025.01)

(58) Field of Classification Search
CPC ................. H10D 30/475–4755; H10D 62/824
See application file for complete search history.

(56) References Cited

U.S. PATENT DOCUMENTS 8,183,596 B2     5/2012   Ueno
9,419,121 B1     8/2016   Teo
(Continued)

FOREIGN PATENT DOCUMENTS

JP          2011077386 A        4/2011
JP          2012114320 A        6/2012
(Continued)

OTHER PUBLICATIONS

Japanese Office Action dated Jun. 11, 2025, mailed in counterpart Japanese Application No. 2022-143848, 8 pages.
(Continued)

*Primary Examiner* — Daniel P Shook
(74) *Attorney, Agent, or Firm* — Kim & Stewart LLP

(57)          ABSTRACT

According to one embodiment, a nitride semiconductor device includes a first semiconductor layer having a heterojunction, a second semiconductor layer on the first semiconductor layer and having another heterojunction, a drain electrode on the second semiconductor layer, a source electrode provided on the first semiconductor layer, a gate electrode provided on the first semiconductor layer between the drain electrode and the source electrode, and a first insulating film between the gate electrode and the drain electrode covering the first semiconductor layer and the second semiconductor layer. The second semiconductor layer being separated from the gate electrode by a portion of the insulating film. A distance from the second semiconductor layer to the gate electrode is shorter than a distance from the drain electrode to the gate electrode.

20 Claims, 5 Drawing Sheets

(51) Int. Cl.
    *H10D 62/85*     (2025.01)
    *H10D 64/23*     (2025.01)
    *H10D 64/27*     (2025.01)

(56)                References Cited

U.S. PATENT DOCUMENTS

| | | |
|---|---|---|
| 2013/0105812 A1 | 5/2013 | Ishigaki |
| 2017/0271495 A1* | 9/2017 | Yoshioka ........... H10D 62/8503 |
| 2022/0020870 A1 | 1/2022 | Nonoda |

FOREIGN PATENT DOCUMENTS

| | | | |
|---|---|---|---|
| JP | 2013098284 A | 5/2013 |
| JP | 2015023258 A | 2/2015 |
| JP | 2016207803 A | 12/2016 |
| JP | 2017168583 A | 9/2017 |
| JP | 2018511169 A | 4/2018 |
| WO | 2020161791 A1 | 10/2021 |

OTHER PUBLICATIONS

Decision to Grant a Patent dated Oct. 1, 2025, mailed in counterpart Japanese Application No. 2022-143848, 5 pages.

\* cited by examiner

NITRIDE SEMICONDUCTOR DEVICE

CROSS-REFERENCE TO RELATED APPLICATION

This application is based upon and claims the benefit of priority from Japanese Patent Application No. 2022-143848, filed Sep. 9, 2022, the entire contents of which are incorporated herein by reference.

FIELD

Embodiments described herein relate generally to a nitride semiconductor device.

BACKGROUND

In recent years, nitride semiconductor devices have been developed as switching devices that control current. Nitride semiconductor materials such as gallium nitride (GaN) have higher carrier density and electron mobility than silicon (Si), and therefore can provide switching devices with higher efficiency. In such a nitride semiconductor device, it is required to avoid deterioration of characteristics due to a current collapse phenomenon.

DETAILED DESCRIPTION

Figure 1:
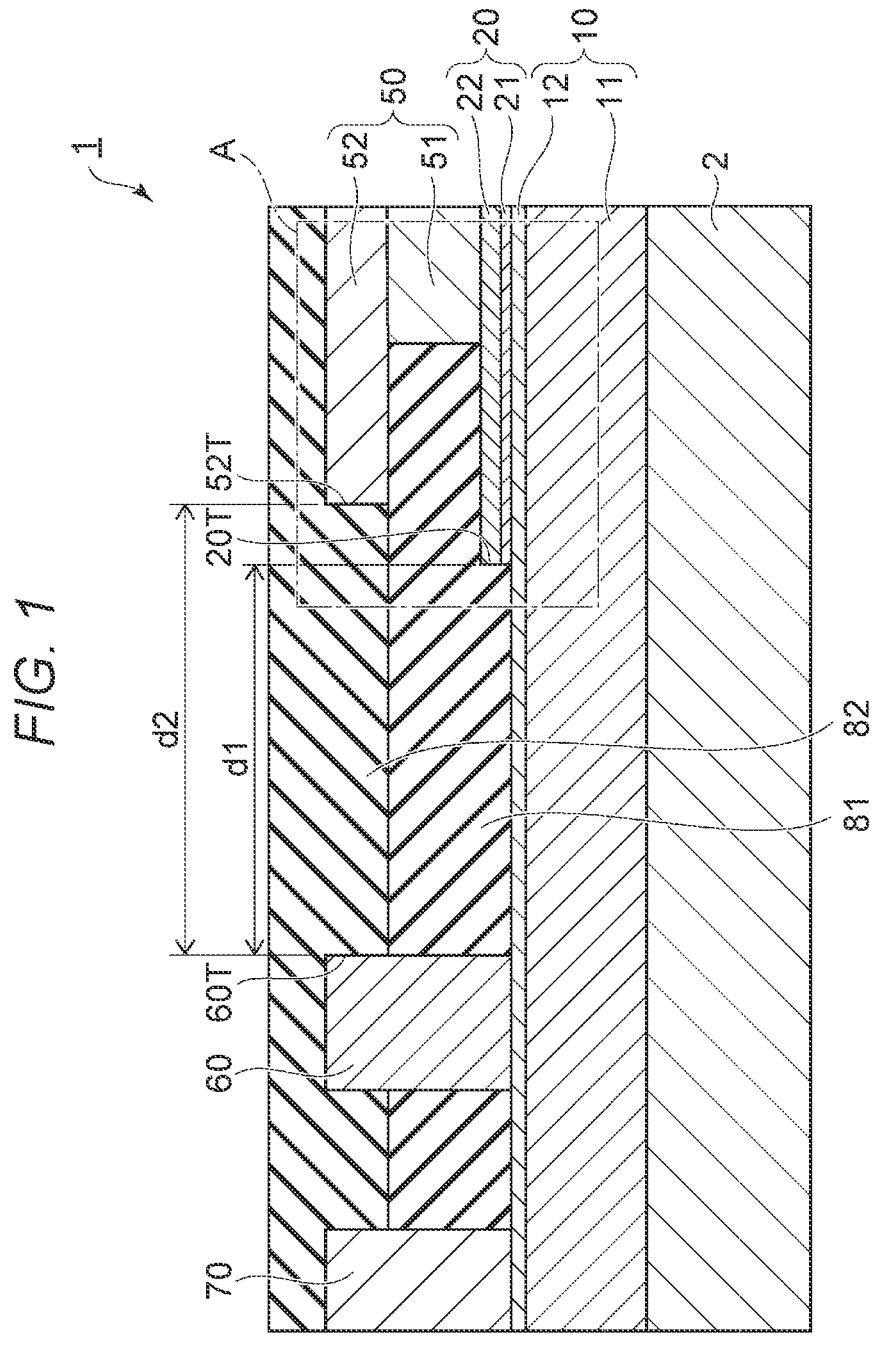
FIG. 1 is a cross-sectional view illustrating a nitride semiconductor device according to a first embodiment.

Embodiments provide a nitride semiconductor device for which deterioration of characteristics due to the current collapse phenomenon is reduced or avoided.

In general, according to one embodiment, a nitride semiconductor device includes a first nitride semiconductor layer, a second nitride semiconductor layer provided on the first nitride semiconductor layer and having a bandgap larger than that of the first nitride semiconductor layer, a third nitride semiconductor layer provided on the second nitride semiconductor layer, a fourth nitride semiconductor layer provided on the third nitride semiconductor layer and having a bandgap larger than that of the third nitride semiconductor layer, a drain electrode provided on the fourth nitride semiconductor layer, a source electrode provided on the second nitride semiconductor layer, a gate electrode provided on the second nitride semiconductor layer at a position between the drain electrode and the source electrode, and a first insulating film covering the second nitride semiconductor layer and the fourth nitride semiconductor layer between the gate electrode and the drain electrode. A portion of the insulating film is between the gate electrode and the third nitride semiconductor layer and the fourth nitride semiconductor layer. A distance from the gate electrode to the third nitride semiconductor layer and the fourth nitride semiconductor layer is shorter than a distance from the gate electrode to the drain electrode.

Hereinafter, certain example embodiments of the present disclosure will be described with reference to the drawings.

The drawings are schematic or conceptual and the depicted relationships between the thickness and width of each portion, the ratios of sizes between different portions, and the like are not necessarily the same as the actual ones. Also, when the same portions or components are shown in different drawings, the depicted dimensions and ratios may be different depending on the drawing.

In addition, in the present specification and drawings, the same reference symbols are given to those elements/portions/components that are the same (or substantially so) as those described already with respect to a previous drawing, and the detailed description of such repeated aspects may be omitted as appropriate.

First Embodiment

FIG. 1 is a cross-sectional view illustrating a nitride semiconductor device according to a first embodiment.

As shown in FIG. 1, a nitride semiconductor device 1 according to the first embodiment includes a first semiconductor layer 10, a second semiconductor layer 20, a drain electrode 50, a gate electrode 60, a source electrode 70, and a first insulating film 81. The first semiconductor layer 10 is provided directly on a substrate 2 in this example. The substrate 2 is, for example, a Si substrate. The second semiconductor layer 20 is provided on the first semiconductor layer 10. The drain electrode 50 is provided on the second semiconductor layer 20. The second semiconductor layer 20 is provided between the drain electrode 50 and the first semiconductor layer 10. In this example, the drain electrode 50 includes a contact portion 51 and a wiring portion 52. The contact portion 51 is provided directly on the second semiconductor layer 20. The contact portion 51 is electrically connected to the second semiconductor layer 20. The wiring portion 52 is provided on the contact portion 51. In a plan view, the outer periphery (perimeter) of the wiring portion 52 is positioned outside the outer periphery (perimeter) of the contact portion 51. That is, the outer planar dimensions of the wiring portion 52 are larger than those of the contact portion 51.

The gate electrode 60 is provided on the first semiconductor layer 10. The first insulating film 81 is provided between the gate electrode 60 and the second semiconductor layer 20. The first semiconductor layer 10 and the second semiconductor layer 20 are stacked one upon the other under the drain electrode 50. The first semiconductor layer 10 is provided under the gate electrode 60, but the second semiconductor layer 20 is not provided thereunder.

The source electrode 70 is provided on the first semiconductor layer 10. The first insulating film 81 is provided between the source electrode 70 and the gate electrode 60.

Upper surfaces of the drain electrode 50, the gate electrode 60, and the source electrode 70 are exposed from the first insulating film 81 in this example. A second insulating film 82 covers the upper surfaces (portions) of the drain electrode 50, the gate electrode 60, and the source electrode 70. The first insulating film 81 and the second insulating film are, for example, nitride films.

The first semiconductor layer 10 includes a first nitride semiconductor layer 11 and a second nitride semiconductor layer 12. The second nitride semiconductor layer 12 is provided on (above) the first nitride semiconductor layer 11. The second nitride semiconductor layer 12 has a bandgap that is larger than that of the first nitride semiconductor layer 11. A heterojunction is formed at the interface between the first nitride semiconductor layer 11 and the second nitride semiconductor layer 12. For example, the first nitride semiconductor layer 11 is an undoped gallium nitride (GaN) layer. For example, the second nitride semiconductor layer 12 is an aluminum gallium nitride (AlGaN) layer.

More generally, each of the first nitride semiconductor layer 11 and the second nitride semiconductor layer 12 can be represented by the following chemical formula (1):

$$Al_xIn_yGa_{(1-x-y)}N \ (0 \leq x \leq 1, \ 0 \leq y \leq 1, \ x+y \leq 1)$$

The first nitride semiconductor layer 11 can be a semiconductor material having any composition in which a composition ratio x and a composition ratio y in the chemical formula (1) are varied within the stated respective ranges. The second nitride semiconductor layer 12 can likewise be a semiconductor material having any composition in which the composition ratio x and the composition ratio y in the chemical formula (1) are varied within the stated respective ranges. The first nitride semiconductor layer 11 and the second nitride semiconductor layer 12 have compositions with different bandgaps and form a heterojunction by an appropriate respective combination of the composition ratio x and the composition ratio y in each material. In formula (1), "In" is the atomic symbol for indium.

The second semiconductor layer 20 includes a third nitride semiconductor layer 21 and a fourth nitride semiconductor layer 22. The fourth nitride semiconductor layer 22 is provided on the third nitride semiconductor layer 21. In plan view, the outer periphery of the third nitride semiconductor layer 21 substantially matches the outer periphery of the fourth nitride semiconductor layer 22. The fourth nitride semiconductor layer 22 has a bandgap larger than that of the third nitride semiconductor layer 21. A heterojunction is formed at the interface between the third nitride semiconductor layer 21 and the fourth nitride semiconductor layer 22. For example, the third nitride semiconductor layer 21 is an undoped GaN layer. For example, the fourth nitride semiconductor layer 22 is an AlGaN layer.

More generally, the third nitride semiconductor layer 21 and the fourth nitride semiconductor layer 22 can also be represented by the above chemical formula (1). The third nitride semiconductor layer 21 can be a semiconductor layer having any composition in which the composition ratio x and the composition ratio y in the chemical formula (1) are varied within their respective stated ranges. The fourth nitride semiconductor layer 22 can be a semiconductor layer having any composition in which the composition ratio x and the composition ratio y in the chemical formula (1) are varied in their stated respective ranges. The third nitride semiconductor layer 21 and the fourth nitride semiconductor layer 22 have different bandgaps and form a heterojunction by having a composition of an appropriate combination of the composition ratio x and the composition ratio y.

The composition of each of the first to fourth nitride semiconductor layers can be appropriately set based on parameters such as the difference in bandgap between semiconductor materials, the thickness of each nitride semiconductor layer, and the like.

As described above, in the nitride semiconductor device 1 according to the first embodiment, by stacking the second semiconductor layer 20 on the first semiconductor layer 10, a structure with two heterojunctions one above the other in the thickness direction of the semiconductor layer is formed. The drain electrode 50 is provided above this repeated (double) heterojunction structure, but the gate electrode 60 is provided above just a single heterojunction (the first semiconductor layer 10) and not above the repeated heterojunction structure.

The gate electrode 60 is provided between the drain electrode 50 and the source electrode 70. A positional relationship between the second semiconductor layer 20 and the drain electrode 50 is set based on the position of an end portion 60T (outer edge surface) of the gate electrode 60. In the following description, the distance between the end portions means the shortest distance between the outer periphery of one element and the outer periphery of the other element in plan view. For example, the distance d1 from the end portion 60T of the gate electrode 60 to an end portion 20T of the second semiconductor layer 20 is the shortest distance between the outer periphery of the gate electrode 60 and the outer periphery of the second semiconductor layer 20 in plan view.

The distance d2 is a distance from the end portion 60T of the gate electrode 60 to the end portion of the drain electrode 50. In this example, the drain electrode 50 includes the contact portion 51 (a first portion) and the wiring portion 52 (a second portion), and the distance d2 is thus the distance from the end portion 60T of the gate electrode 60 to an end portion 52T of the wiring portion 52. If the outer periphery of the contact portion 51 were outside the outer periphery of the wiring portion 52 in plan view, the distance d2 would be the distance from the end portion 60T of the gate electrode 60 to an end portion (outer edge) of the contact portion 51.

In the nitride semiconductor device 1 according to the first embodiment, the distance d1 is a non-zero value. In other words, the second semiconductor layer 20 does not contact the gate electrode 60. The distance d1 (a first distance) is thus set to be shorter than the distance d2 (a second distance). In the region between the gate electrode 60 and the drain electrode 50, the outer periphery of the second semiconductor layer 20 in plan view is positioned outside (beyond) the outer periphery of the drain electrode 50.

In the nitride semiconductor device 1 according to the first embodiment, the repeated structure of the two heterojunctions increases the carrier density. Therefore, by locating the drain electrode 50 on the repeated heterojunction structure, it is possible to prevent the spread of the depletion layer in the vicinity under the drain electrode 50. By preventing the spread of the depletion layer, the punch-through voltage between the source electrode 70 and the drain electrode 50 can be increased, and the influence of the current collapse phenomenon due to the reduction of the punch-through voltage can be prevented.

In the nitride semiconductor device 1 according to the first embodiment, the distance d1 from the end portion 20T of the second semiconductor layer 20 (which forms the repeated heterojunction structure) to the end portion 60T of the gate electrode 60 is shorter than the distance d2 from the end portion 52T of the drain electrode 50 to the end portion 60T of the gate electrode 60. That is, the repeated heterojunction structure is not provided under the gate electrode 60, and a low threshold voltage can be achieved by the single heterojunction.

In the above example, the second semiconductor layer 20 is provided between the drain electrode 50 and the first semiconductor layer 10, but the present disclosure is not limited thereto. In other examples, the second semiconductor layer 20 may be provided between the source electrode 70 and the first semiconductor layer 10. In addition, is only necessary for the second semiconductor layer 20 not to be provided between the gate electrode 60 and the first semiconductor layer 10 and, in some examples, the second semiconductor layer may be between the drain electrode 50 and the first semiconductor layer 10, between the source electrode 70 and the first semiconductor layer 10, and between the first insulating film 81 and the first semiconductor layer 10. By such an arrangement, the drain electrode 50 and the source electrode 70 can be formed in the same steps in the manufacturing process of the nitride semiconductor device 1, and the manufacturing process can be simplified. These matters also apply to the case of the second embodiment, which will be described below.

The operation of the nitride semiconductor device 1 according to the first embodiment will be described.

Figure 2:
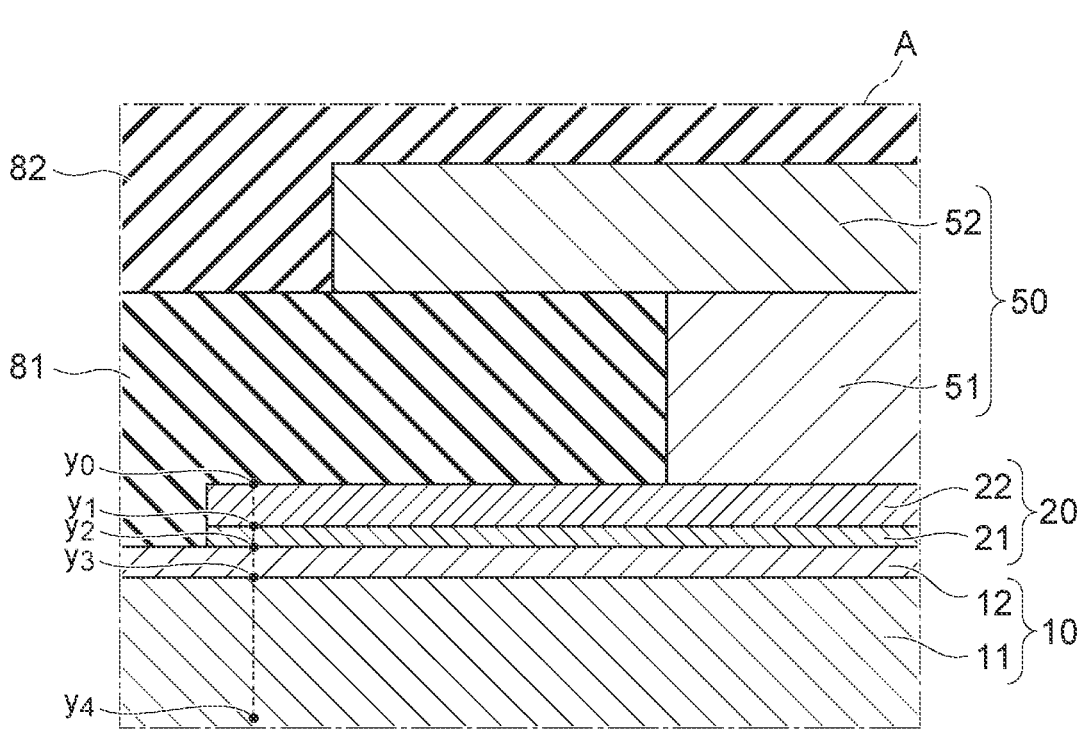
FIG. 2 is an enlarged view of region A of FIG. 1.

FIG. 2 is an enlarged view of region A of FIG. 1.

Figure 3:
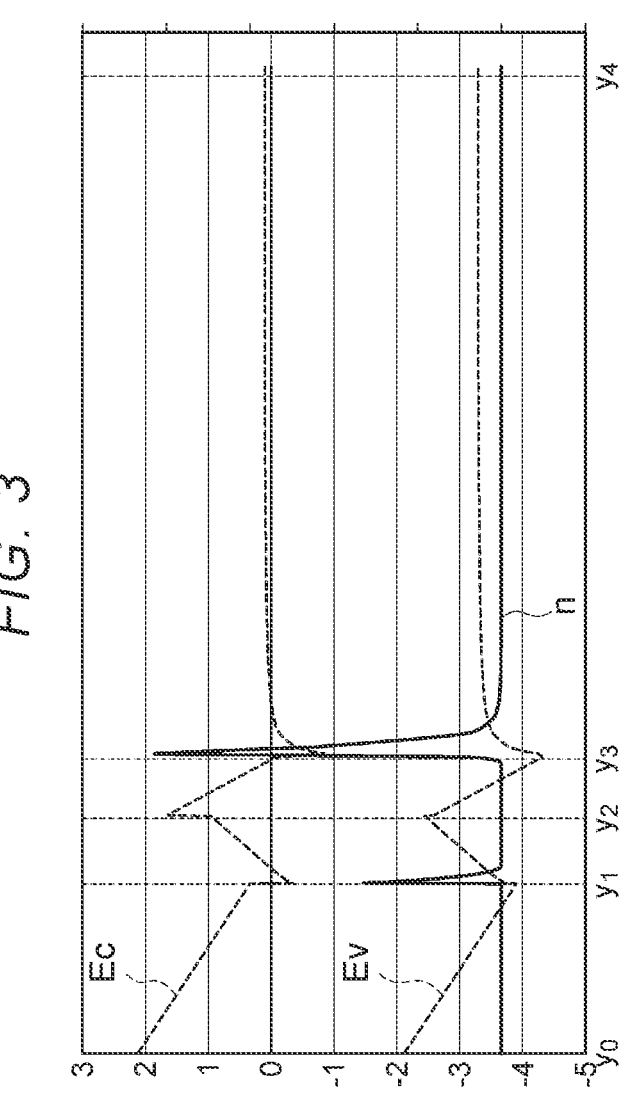
FIG. 3 is a graph showing energy levels related to the operation of a nitride semiconductor device according to a first embodiment.

FIG. 3 is a graph showing energy levels related to the operation of the nitride semiconductor device 1 according to the first embodiment.

In FIG. 2, the respective positions of the first to fourth nitride semiconductor layers (11, 12, 21, and 22) are defined in order to describe the relationship between the energy levels and the carrier densities shown in FIG. 3.

A position y0 is the position of the fourth nitride semiconductor layer 22 and is a position on the connection surface (interface) with the first insulating film 81. A position y1 is the position of the third nitride semiconductor layer 21 and a position on the connection surface (interface) with the fourth nitride semiconductor layer 22. A position y2 is the position of the third nitride semiconductor layer 21 and is a position on the connection surface (interface) with the second nitride semiconductor layer 12. A position y3 is the position of the second nitride semiconductor layer 12 and is a position on the connection surface (interface) with the first nitride semiconductor layer 11. A position y4 is a position inside the first nitride semiconductor layer 11 sufficiently separated from the connection surface with the second nitride semiconductor layer 12 to be considered substantially unaffected by the presence of the connection surface.

In FIG. 3, the horizontal axis represents linear positions corresponding to positions y0 to y4. The distance from the position y0 to the position y1 in FIG. 3 represents the thickness of the fourth nitride semiconductor layer 22. The distance from the position y1 to the position y2 represents the thickness of the third nitride semiconductor layer 21. The distance from the position y2 to the position y3 represents the thickness of the second nitride semiconductor layer 12.

The solid graphed line in FIG. 3 represents the magnitude of carrier concentration (n) at each position. The upper portion dashed line represents the magnitude of the conduction band Ec at each position. The lower portion dashed line represents the magnitude of the valence band Ev at each position. In FIG. 3, the change in bandgap from the position y0 to the position y4 is shown. The energy level of 0 (eV) represents the Fermi level.

As shown in FIG. 3, at the position y1, a two-dimensional electron gas (2DEG) is formed on the third nitride semiconductor layer 21 side due to the difference between the bandgap of the fourth nitride semiconductor layer 22 and the bandgap of the third nitride semiconductor layer 21. The 2DEG of the third nitride semiconductor layer 21 has a high carrier density n and functions as a channel.

At the position y3, a 2DEG is formed on the first nitride semiconductor layer 11 side due to the difference between the bandgap of the second nitride semiconductor layer 12 and the bandgap of the first nitride semiconductor layer 11. The 2DEG of the first nitride semiconductor layer 11 also has a high carrier density n and functions as a channel.

By appropriately setting the thickness of each of the second nitride semiconductor layer 12, the third nitride semiconductor layer 21, and the fourth nitride semiconductor layer 22, carriers (electrons) of the two layers of 2DEG can overcome the barrier, and a current will flow. In the region of the repeated heterojunction structure formed by stacking the first semiconductor layer 10 and the second semiconductor layer 20, the effective carrier density is higher than that if just single semiconductor layers were to be used. Therefore, in the nitride semiconductor device 1 according to the first embodiment, the spread of the depletion layer under the drain electrode 50 is prevented. Further, in the nitride semiconductor device 1 according to the first embodiment, the carrier density can be maintained sufficiently high when the channel is formed, so the output current density can be improved and a lower on-resistance can be achieved.

In the nitride semiconductor device 1 shown in FIG. 1, the second semiconductor layer 20 is not provided under the gate electrode 60, but the first semiconductor layer 10 is provided thereunder. Since the threshold voltage of nitride semiconductor device 1 is determined by the energy level relationship between the gate electrode 60 and the first semiconductor layer 10, a sufficiently low threshold voltage can be achieved.

The operation of the nitride semiconductor device 1 according to the first embodiment will be described with reference to the operation of a nitride semiconductor device of a comparative example.

Figure 4:
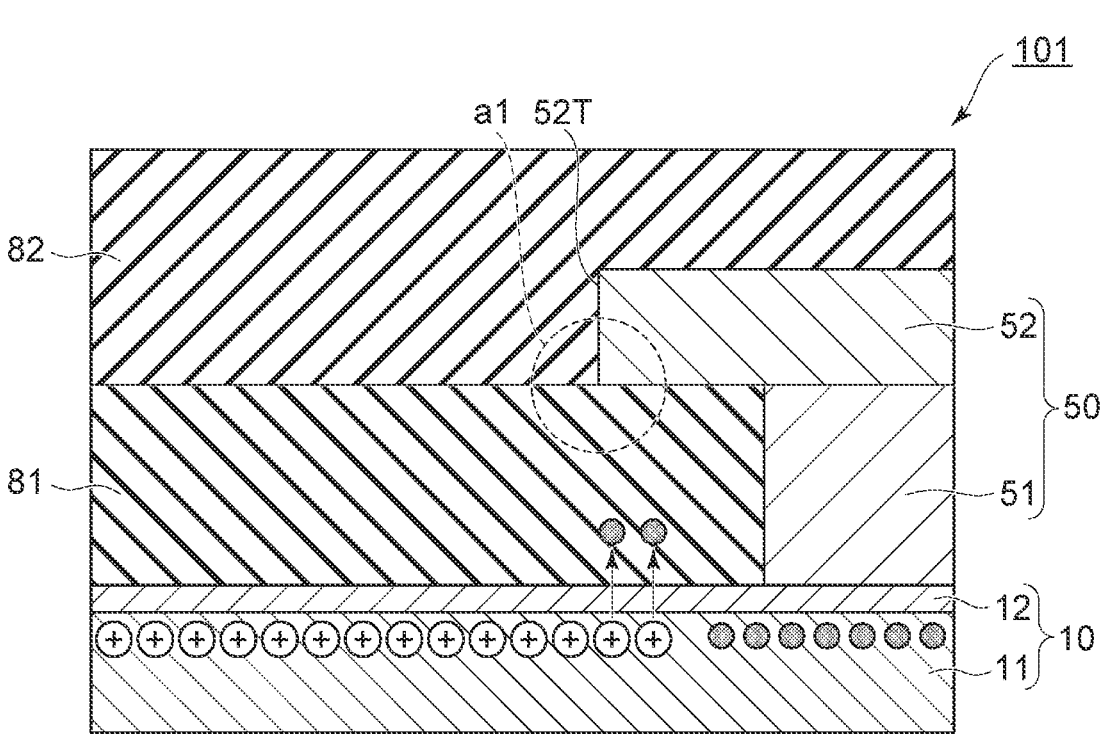
FIG. 4 is a cross-sectional view illustrating a nitride semiconductor device of a comparative example.

FIG. 4 is a cross-sectional view illustrating the nitride semiconductor device of the comparative example. FIG. 4 shows a cross section corresponding in position to region A depicted in FIG. 1. As shown in FIG. 4, a nitride semiconductor device 101 of the comparative example includes a first semiconductor layer 10, a drain electrode 50, and a first insulating film 81. A second insulating film 82 covers the drain electrode 50. Although not specifically depicted in FIG. 4, the first insulating film 81 is provided between a gate electrode 60 and the drain electrode 50 as in the case shown in FIG. 1. Also, the gate electrode 60 is provided between a source electrode 70 and the drain electrode 50.

A high voltage may be applied between the source electrode 70 and the drain electrode 50 depending on the operating state of the nitride semiconductor device 101. Since a voltage equal to or lower than the voltage of the source electrode 70 is applied to the gate electrode 60, when a high voltage is applied between the source electrode 70 and the drain electrode 50, a high voltage is also applied between the gate electrode 60 and the drain electrode 50.

Since the gate electrode 60 is located between the source electrode 70 and the drain electrode 50, when a high voltage is applied between the gate electrode 60 and the drain electrode 50, a strong electric field is formed at the first insulating film 81 from the gate electrode 60 toward the drain electrode 50. Since the electric field in this case tends to concentrate on an end portion 52T, a high electric field may be generated in a region a1 near the end portion 52T in the first insulating film 81.

When a high electric field region is formed between the gate electrode 60 and the drain electrode 50, the depletion layer spreads, and when the depletion layer reaches the drain electrode 50, punch-through occurs and carriers can move from the first semiconductor layer 10 to the first insulating film 81. Since the first insulating film 81 is an insulator, the carriers introduced into the first insulating film 81 are then essentially trapped, and the carrier density in the 2DEG of the first semiconductor layer 10 thus substantially decreases.

This is referred to as a current collapse phenomenon due to the punch-through in the depletion layer near the drain electrode 50.

In the nitride semiconductor device 1 according to the first embodiment, the drain electrode 50 is located on the repeated structure of two heterojunctions. These two heterojunctions each form a 2DEG, and carriers are generated for each 2DEG. Under the drain electrode 50, the carrier density is improved and a higher carrier density is achieved. Even when a high voltage is applied, the depletion layer is less likely to spread to the vicinity of the drain electrode 50, and punch-through is less likely to occur. Therefore, in the nitride semiconductor device 1, it is possible to prevent the current collapse phenomenon that might otherwise be caused by punch-through, and thus achieve high output current density and low on-resistance.

In the nitride semiconductor device 1 according to the first embodiment, the distance d1 between the end portion 60T of the gate electrode 60 and the end portion 20T of the second semiconductor layer 20 is shorter than the distance d2 between the end portion 60T and the end portion 52T of the drain electrode 50. Therefore, even if electric field concentration occurs in some region near the drain electrode 50, the repeated structure of the two heterojunctions can help prevent the spread of the depletion layer and make punch-through less likely to occur. Therefore, a current collapse phenomenon caused by punch-through can be avoided.

In the nitride semiconductor device 1 according to the first embodiment, the gate electrode 60 is provided on the first semiconductor layer 10 having a single heterojunction. The threshold voltage of the nitride semiconductor device 1 is determined by the energy level relationship between the first semiconductor layer 10 and the gate electrode 60. Therefore, the nitride semiconductor device 1 can achieve stable characteristics without increasing the threshold voltage.

Second Embodiment

Figure 5:
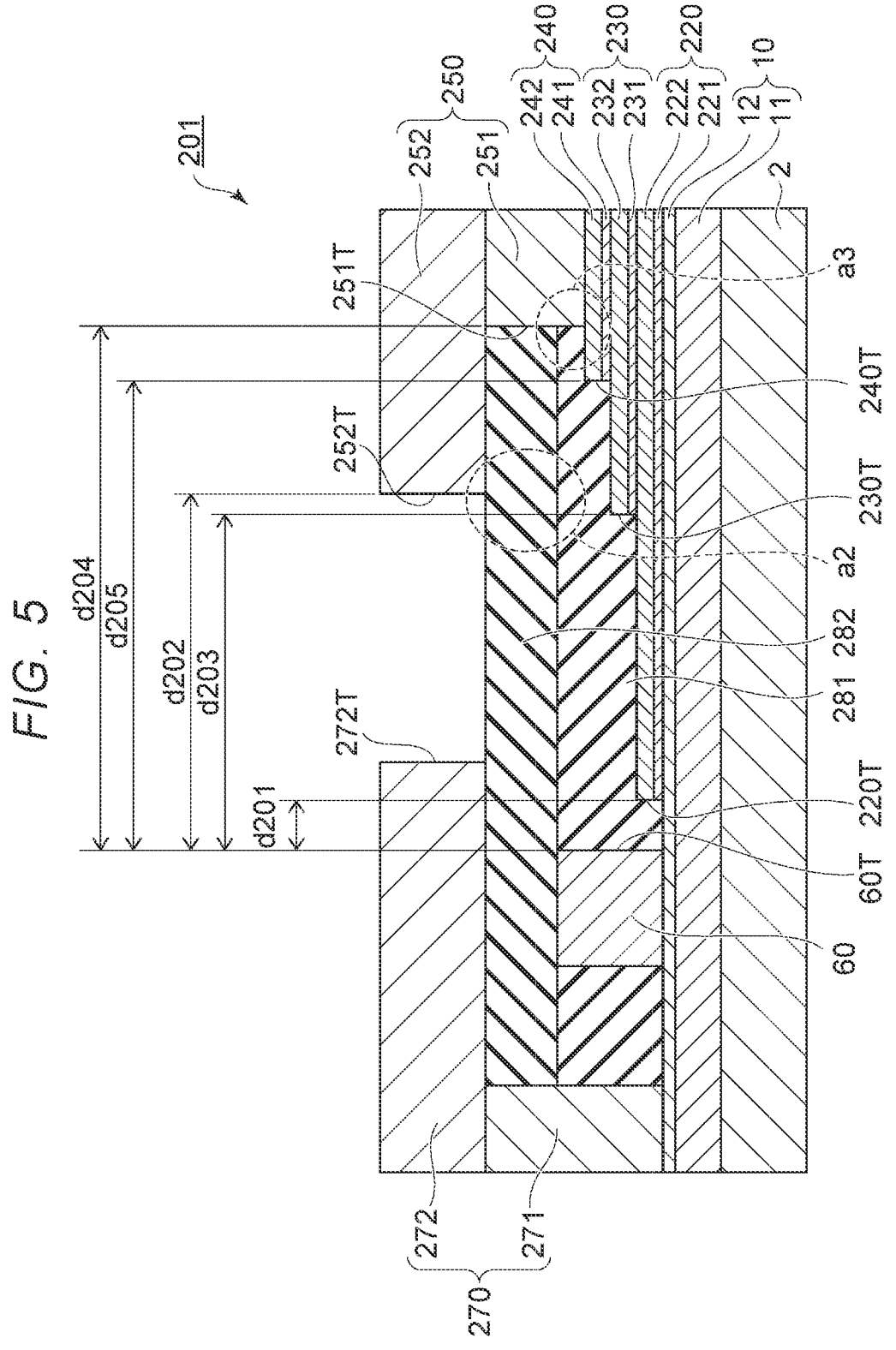
FIG. 5 is a cross-sectional view illustrating a nitride semiconductor device according to a second embodiment.

FIG. 5 is a cross-sectional view illustrating a nitride semiconductor device according to the second embodiment.

As shown in FIG. 5, a nitride semiconductor device 201 according to the second embodiment includes a first semiconductor layer 10, a second semiconductor layer 220, a third semiconductor layer 230, a fourth semiconductor layer 240, a drain electrode 250, a gate electrode 60, a source electrode 270, a first insulating film 281, and a second insulating film 282. The configurations of the first semiconductor layer 10 and the gate electrode 60 are the same as those in the first embodiment. And, in general, those elements or aspects that are the same as in the first embodiment are denoted by the same reference numerals, and additional description thereof may be omitted.

To prevent the spread of the depletion layer in the area under the drain electrode and increase the punch-through voltage, a repeated structure of three or more heterojunctions may be provided. The nitride semiconductor device 201 according to the second embodiment includes four semiconductor layers under the drain electrode 250, and each of the four semiconductor layers provides a heterojunction and the nitride semiconductor device 201 thus has a repeated structure of the four heterojunctions.

The second semiconductor layer 220 is provided on the first semiconductor layer 10. The third semiconductor layer 230 is provided on the second semiconductor layer 220. The fourth semiconductor layer 240 is provided on the third semiconductor layer 230. The drain electrode 250 is provided on the fourth semiconductor layer 240. That is, the first semiconductor layer 10, the second semiconductor layer 220, the third semiconductor layer 230, and the fourth semiconductor layer 240 are each provided under the drain electrode 250. The first semiconductor layer 10, the second semiconductor layer 220, the third semiconductor layer 230, and the fourth semiconductor layer 240 are stacked in this order from the substrate 2 side toward the drain electrode 250 side.

The first semiconductor layer 10 includes a first nitride semiconductor layer 11 and a second nitride semiconductor layer 12, as in the first embodiment. The configurations and compositions of the first nitride semiconductor layer 11 and the second nitride semiconductor layer 12 can be the same as those in the first embodiment.

The second semiconductor layer 220 includes a third nitride semiconductor layer 221 and a fourth nitride semiconductor layer 222. The fourth nitride semiconductor layer 222 is provided on the third nitride semiconductor layer 221. In plan view, the outer periphery of the third nitride semiconductor layer 221 substantially matches the outer periphery of the fourth nitride semiconductor layer 222. The fourth nitride semiconductor layer 222 has a bandgap larger than that of the third nitride semiconductor layer 221. A heterojunction is formed at the interface between the third nitride semiconductor layer 221 and the fourth nitride semiconductor layer 222. For example, the third nitride semiconductor layer 221 is an undoped GaN layer. For example, the fourth nitride semiconductor layer 222 is an AlGaN layer.

More generally, the compositions of the third nitride semiconductor layer 221 and the fourth nitride semiconductor layer 222 are represented by the above chemical formula (1). The third nitride semiconductor layer 221 and the fourth nitride semiconductor layer 222 have different bandgaps and form a heterojunction by having a composition of an appropriate combination of the composition ratio x and the composition ratio y.

The third semiconductor layer 230 includes a fifth nitride semiconductor layer 231 and a sixth nitride semiconductor layer 232. The sixth nitride semiconductor layer 232 is provided on the fifth nitride semiconductor layer 231. In plan view, the outer periphery of the fifth nitride semiconductor layer 231 substantially matches the outer periphery of the sixth nitride semiconductor layer 232. The sixth nitride semiconductor layer 232 has a bandgap larger than that of the fifth nitride semiconductor layer 231. A heterojunction is formed at the interface between the fifth nitride semiconductor layer 231 and the sixth nitride semiconductor layer 232. For example, the fifth nitride semiconductor layer 231 is an undoped GaN layer. For example, the sixth nitride semiconductor layer 232 is an AlGaN layer.

More generally, the compositions of the fifth nitride semiconductor layer 231 and the sixth nitride semiconductor layer 232 are represented by the above chemical formula (1). The fifth nitride semiconductor layer 231 and the sixth nitride semiconductor layer 232 have different bandgaps and form a heterojunction by having a composition of an appropriate combination of the composition ratio x and the composition ratio y.

The fourth semiconductor layer 240 includes a seventh nitride semiconductor layer 241 and an eighth nitride semiconductor layer 242. The eighth nitride semiconductor layer 242 is provided on the seventh nitride semiconductor layer 241. In plan view, the outer periphery of the seventh nitride semiconductor layer 241 substantially matches the outer periphery of the eighth nitride semiconductor layer 242. The eighth nitride semiconductor layer 242 has a bandgap larger than that of the seventh nitride semiconductor layer 241. A heterojunction is formed at the interface between the seventh nitride semiconductor layer 241 and the eighth nitride semiconductor layer 242. For example, the seventh nitride semiconductor layer 241 is an undoped GaN layer. For example, the eighth nitride semiconductor layer 242 is an AlGaN layer.

More generally, the compositions of the seventh nitride semiconductor layer 241 and the eighth nitride semiconductor layer 242 are represented by the above chemical formula (1). The seventh nitride semiconductor layer 241 and the eighth nitride semiconductor layer 242 have different bandgaps and form a heterojunction by having a composition of an appropriate combination of the composition ratio x and the composition ratio y.

The composition of each of the first to eighth nitride semiconductor layers can be appropriately set based on the differences in bandgap between semiconductor materials, the thickness of each nitride semiconductor layer, and the like.

The gate electrode 60 is provided on just the first semiconductor layer 10. The second semiconductor layer 220, the third semiconductor layer 230, and the fourth semiconductor layer 240 are not under the gate electrode 60.

The drain electrode 250 includes a contact portion 251 and a wiring portion 252. The wiring portion 252 is provided on the contact portion 251. In plan view, the outer periphery of the wiring portion 252 is positioned outside (beyond) the outer periphery of the contact portion 251 at least on the gate electrode 60 side. That is, in plan view, the wiring portion 252 protrudes beyond the contact portion 251.

The source electrode 270 includes a contact portion 271 and a wiring portion 272. The wiring portion 272 is provided on the contact portion 271. In plan view, the outer periphery of the wiring portion 272 is positioned outside (beyond) the outer periphery of the contact portion 271 on the drain electrode 250 side. That is, in plan view, the wiring portion 272 protrudes beyond the contact portion 271.

The first insulating film 281 is provided between the gate electrode 60 and the contact portion 251 of the drain electrode 250. The first insulating film 281 is provided between the gate electrode 60 and the contact portion 271 of the source electrode 270. In this example, second insulating film 282 is provided on the first insulating film 281 to be between the contact portion 271 of the source electrode 270 and the contact portion 251 of the drain electrode 250. The first insulating film 281 and the second insulating film 282 are, for example, nitride films.

The wiring portion 272 of the source electrode 270 is electrically connected to the substrate 2, for example. By setting the source electrode 270 to the same voltage as the substrate 2 and providing the wiring portion 272 to protrude toward the wiring portion 252 of the drain electrode 250 and be above the gate electrode 60, the wiring portion 272 can function as a field plate. By having the wiring portion 272 function as a field plate, the concentration of an electric field when a high voltage is applied between the wiring portion 272 and the drain electrode 250 can be somewhat alleviated.

When a high voltage is applied between the source electrode 270 and the drain electrode 250, a high voltage is also applied between the gate electrode 60 and the drain electrode 250. In that case, a high electric field is applied to the second insulating film 282 and the first insulating film 281 (region a2) in the vicinity of an end portion 252T of the wiring portion 252 of the drain electrode 250. A high electric field may also be applied to the first insulating film 281 (region a3) in the vicinity of an end portion 251T of the contact portion 251 of the drain electrode 250. Due to these electric field concentrations, a depletion layer spreads in the semiconductor layer in the vicinity of the regions a2 and a3, and if punch-through occurs, carriers may be trapped in the insulating films.

The first semiconductor layer 10 is the same as that in the first embodiment and includes the first nitride semiconductor layer 11 and the second nitride semiconductor layer 12. The second semiconductor layer 220 includes the third nitride semiconductor layer 221 and the fourth nitride semiconductor layer 222. The third semiconductor layer 230 includes the fifth nitride semiconductor layer 231 and the sixth nitride semiconductor layer 232. The fourth semiconductor layer 240 includes the seventh nitride semiconductor layer 241 and the eighth nitride semiconductor layer 242.

The relationship between the two nitride semiconductor layers in each semiconductor layer is such that a nitride semiconductor layer with a narrow bandgap is provided on a nitride semiconductor layer with a wide bandgap, and a heterojunction forming a 2DEG is formed therebetween. In the nitride semiconductor device 201 according to the second embodiment, four semiconductor layers form a repeated structure of four heterojunctions. Therefore, in the repeated heterojunction structure, the carrier density increases according to the number of repetitions of the heterojunction.

The positional relationship between the second to fourth semiconductor layers 220 to 240 and the drain electrode 250 is set based on the position of an end portion 60T of the gate electrode 60 in a manner similar to the first embodiment. In this example, the positions of the end portions are different for each semiconductor layer.

The distance d201 (a first distance) is the distance from the end portion 60T of the gate electrode 60 to an end portion 220T of the second semiconductor layer 220. The distance d202 (a second distance) is the distance from the end portion 60T of the gate electrode 60 to the end portion 252T of the wiring portion 252 of the drain electrode 250. The distance d203 (a third distance) is the distance from the end portion 60T of the gate electrode 60 to an end portion 230T of the third semiconductor layer 230. The distance d204 (a fourth distance) is the distance from the end portion 60T of the gate electrode 60 to the end portion 251T of the contact portion 251 of the drain electrode 250. The distance d205 (a fifth distance) is the distance from the end portion 60T of the gate electrode 60 to an end portion 240T of the fourth semiconductor layer 240.

Since the gate electrode 60 and the ends of each semiconductor layer (10, 220, 230, 240) are spaced apart from each other, the distances d201 to d205 are each non-zero, positive values. In this example, the distance d201 is a positive value less than any of the distances d202 to d205. The distance d203 is less than the distance d202, and the distance d205 is less than the distance d204. That is, in this example, the repeated heterojunction structure increases in the number of repetitions as it gets closer to the drain electrode 250 from the gate electrode 60. A decrease in carrier density during the application of a high voltage can be further prevented as the number of repetitions of the repeated structure of the semiconductor layer increases. In this example, the closer to the contact portion 251 of the drain electrode 250 from the gate electrode 60, the greater the concentration of the electric field when a high voltage is applied. By increasing the number of repetitions of the repeated structure of the semiconductor layer according to the state of electric field concentration, the carrier density can be kept substantially constant when the channel is formed.

In a repeated heterojunction structure, the number of repetitions of the heterojunction under the drain electrode can be set to any appropriate number according to the arrangement of each electrode, the material of the insulating film, and the like. In addition, in some examples, such as when the number of repetitions is 3 or more, the distances to the end portions of two or more semiconductor layers from the end portion 60T of the gate electrode 60 may be set to be the same distance. Or, in some examples, the distances to the end portions of all semiconductor layers may be set to the same, depending on the arrangement of each electrode, the material of the insulating film, and the like.

According to the embodiments described above, it is possible to achieve a nitride semiconductor device in which deterioration in characteristics due to the current collapse phenomenon is improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A nitride semiconductor device, comprising:
a first nitride semiconductor layer;
a second nitride semiconductor layer on the first nitride semiconductor layer and having a bandgap larger than that of the first nitride semiconductor layer;
a third nitride semiconductor layer on the second nitride semiconductor layer;
a fourth nitride semiconductor layer on the third nitride semiconductor layer and having a bandgap larger than that of the third nitride semiconductor layer;
a drain electrode on the fourth nitride semiconductor layer;
a source electrode on the second nitride semiconductor layer;
a gate electrode on the second nitride semiconductor layer at a position between the drain electrode and the source electrode;
a first insulating film covering the second nitride semiconductor layer and the fourth nitride semiconductor layer between the gate electrode and the drain electrode;
a fifth nitride semiconductor layer on the fourth nitride semiconductor layer; and
a sixth nitride semiconductor layer on the fifth nitride semiconductor layer and having a bandgap larger than that of the fifth nitride semiconductor layer, wherein
a portion of the first insulating film is between the gate electrode and the third nitride semiconductor layer and the fourth nitride semiconductor layer,
a first distance from the gate electrode to each of the third and fourth nitride semiconductor layers is shorter than a second distance from the gate electrode to the drain electrode,
the drain electrode contacts the sixth nitride semiconductor layer,
a portion of the first insulating film is between the gate electrode and the fifth nitride semiconductor layer and the sixth nitride semiconductor layer, and a third distance from the gate electrode to each of the fifth and sixth nitride semiconductor layers is shorter than the second distance.

2. The nitride semiconductor device according to claim 1, wherein
the drain electrode includes a first portion on the fourth nitride semiconductor layer and a second portion on the first portion,
an outer edge of the second portion is located beyond an outer edge of the first portion, and
the second portion is closer to the gate electrode than is the first portion.

3. The nitride semiconductor device according to claim 1, wherein the drain electrode includes:
a first portion contacting the sixth nitride semiconductor layer, and
a second portion on the first portion.

4. The nitride semiconductor device according to claim 1, wherein the first distance is shorter than the third distance.

5. The nitride semiconductor device according to claim 1, wherein each of the first, second, third, fourth, fifth, and sixth nitride semiconductor layers respectively comprise a material corresponding to a chemical formula $Al_xIn_yGa_{(1-x-y)}N$, where values of x and y for each of the first to sixth nitride semiconductor layers separately satisfy the following relationships $0 \le x \le 1$, $0 \le y \le 1$, $x+y \le 1$.

6. The nitride semiconductor device according to claim 1, wherein the third nitride semiconductor layer and the fourth nitride semiconductor layer are between the source electrode and the second nitride semiconductor layer.

7. A nitride semiconductor device, comprising:
a first nitride semiconductor layer;
a second nitride semiconductor layer on the first nitride semiconductor layer;
a third nitride semiconductor layer on the second nitride semiconductor layer;
a fourth nitride semiconductor layer on the third nitride semiconductor layer;
a drain electrode on the fourth nitride semiconductor layer;
a source electrode on the second nitride semiconductor layer;
a gate electrode on the second nitride semiconductor layer at a position between the drain electrode and the source electrode;
a first insulating film cover the second nitride semiconductor layer and the fourth nitride semiconductor layer between the gate electrode and the drain electrode;
a fifth nitride semiconductor layer on the fourth nitride semiconductor layer; and
a sixth nitride semiconductor layer on the fifth nitride semiconductor layer, wherein
ends of the third nitride semiconductor layer and the fourth nitride semiconductor layer nearest the gate electrode are separated from the gate electrode,
a first distance from the gate electrode to the ends of the third nitride semiconductor layer and the fourth nitride semiconductor layer is shorter than a second distance from the gate electrode to the drain electrode,
the drain electrode contacts the sixth nitride semiconductor layer,
a portion of the first insulating film is between the gate electrode and the fifth nitride semiconductor layer and the sixth nitride semiconductor layer, and
a third distance from the gate electrode to each of the fifth and sixth nitride semiconductor layers is shorter than the second distance.

8. The nitride semiconductor device according to claim 7, wherein each of the first, second, third, and fourth nitride semiconductor layers respectively comprise a material corresponding to a chemical formula $Al_xIn_yGa_{(1-x-y)}N$, where values of x and y for each of the first to fourth nitride semiconductor layers separately satisfy the following relationships $0 \le x \le 1$, $0 \le y \le 1$, $x+y \le 1$.

9. The nitride semiconductor device according to claim 8, wherein the second nitride semiconductor layer has a bandgap larger than the first nitride semiconductor layer.

10. The nitride semiconductor device according to claim 9, wherein the fourth nitride semiconductor layer has a bandgap larger than the third nitride semiconductor layer.

11. The nitride semiconductor device according to claim 8, wherein the fourth nitride semiconductor layer has a bandgap larger than the third nitride semiconductor layer.

12. The nitride semiconductor device according to claim 7, wherein the second nitride semiconductor layer has a bandgap larger than the first nitride semiconductor layer.

13. The nitride semiconductor device according to claim 12, wherein the fourth nitride semiconductor layer has a bandgap larger than the third nitride semiconductor layer.

14. The nitride semiconductor device according to claim 7, wherein the fourth nitride semiconductor layer has a bandgap larger than the third nitride semiconductor layer.

15. The nitride semiconductor device according to claim 7, wherein the drain electrode includes a first portion contacting the sixth nitride semiconductor layer and a second portion on the first portion, an outer edge of the second portion is located beyond an outer edge of the first portion, and the second portion is closer to the gate electrode than is the first portion.

16. The nitride semiconductor device according to claim 7, wherein the first distance is shorter than the third distance.

17. A nitride semiconductor device, comprising:

a first nitride semiconductor layer;

a second nitride semiconductor layer above the first nitride semiconductor layer in a first direction;

a third nitride semiconductor layer above the second nitride semiconductor layer in the first direction;

a fourth nitride semiconductor layer above the third nitride semiconductor layer in the first direction;

a drain electrode above the third and fourth nitride semiconductor layers in the first direction;

a source electrode spaced above the second nitride semiconductor layer in the first direction and spaced from the drain electrode in a second direction perpendicular to the first direction;

a gate electrode contacting the second nitride semiconductor layer at a position between the drain electrode and the source electrode in the second direction;

a first insulating film covering the second nitride semiconductor layer and the fourth nitride semiconductor layer between the gate electrode and the drain electrode in the second direction;

a fifth nitride semiconductor layer on the fourth nitride semiconductor layer; and a sixth nitride semiconductor layer on the fifth nitride semiconductor layer, wherein a first portion of the first insulating film is between the gate electrode and an end portion of third nitride semiconductor layer in the second direction, a second portion of the first insulating film is between the gate electrode and an end portion of the fourth nitride semiconductor layer in the second direction, a first distance from the gate electrode to either one of the end portions of the third and fourth nitride semiconductor layers in the second direction is shorter than a second distance from the gate electrode to the drain electrode in the second direction, the drain electrode is above the sixth nitride semiconductor layer, a third portion of the first insulating film is between the gate electrode and the fifth nitride semiconductor layer and the sixth nitride semiconductor layer, and a third distance from the gate electrode to each of the fifth and sixth nitride semiconductor layers is shorter than the second distance.

18. The nitride semiconductor device according to claim 17, wherein a bandgap of the second nitride semiconductor layer is larger than a bandgap of the first nitride semiconductor layer, and a bandgap of the fourth nitride semiconductor layer is larger than a bandgap of the third nitride semiconductor layer.

19. The nitride semiconductor device according to claim 17, wherein the first distance is shorter than the third distance.

20. The nitride semiconductor device according to claim 17, wherein each of the first, second, third, fourth, fifth, and sixth nitride semiconductor layers respectively comprise a material corresponding to a chemical formula $Al_xIn_yGa_{(1-x-y)}N$, where values of x and y for each of the first to sixth nitride semiconductor layers separately satisfy the following relationships $0 \le x \le 1$, $0 \le y \le 1$, $x+y \le 1$.

\* \* \* \* \*